(12) United States Patent
Qiu et al.

(10) Patent No.: US 9,922,972 B1
(45) Date of Patent: Mar. 20, 2018

(54) EMBEDDED SILICON CARBIDE BLOCK PATTERNING

(71) Applicant: GLOBALFOUNDRIES INC., Grand Cayman (KY)

(72) Inventors: Xiaofeng Qiu, Ballston Lake, NY (US); Haigou Huang, Malta, NY (US); Chang Ho Maeng, Cohoes, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/491,222

(22) Filed: Apr. 19, 2017

(51) Int. Cl.
| | |
|---|---|
| *H01L 21/461* | (2006.01) |
| *H01L 23/12* | (2006.01) |
| *H01L 23/043* | (2006.01) |
| *H01L 27/088* | (2006.01) |
| *H01L 21/02* | (2006.01) |
| *H01L 21/308* | (2006.01) |
| *H01L 21/8234* | (2006.01) |

(52) U.S. Cl.
CPC ...... *H01L 27/088* (2013.01); *H01L 21/02167* (2013.01); *H01L 21/3081* (2013.01); *H01L 21/823437* (2013.01)

(58) Field of Classification Search
CPC .......... H01L 21/02167; H01L 21/0445; H01L 21/31053; H01L 21/311; H01L 21/31144; H01L 21/76802; H01L 21/7683; H01L 21/02529; H01L 21/0332; H01L 21/76843; H01L 23/53295; H01L 29/0649
USPC ................ 438/694, 696, 700–702, 723, 734, 438/736–739, 756; 257/701, 709, 760
See application file for complete search history.

(56) References Cited

U.S. PATENT DOCUMENTS

| | | | |
|---|---|---|---|
| 9,384,996 B2 * | 7/2016 | Huang | H01L 29/66545 |
| 9,558,995 B2 * | 1/2017 | Bu | H01L 21/76837 |

* cited by examiner

*Primary Examiner* — Hsien Ming Lee
(74) *Attorney, Agent, or Firm* — Scully Scott Murphy and Presser; Frank DiGiglio

(57) ABSTRACT

A lithography method and accompanying structure for decreasing the critical dimension (CD) and improving the CD uniformity within semiconductor devices uses a layer of silicon carbide as an embedded blocking mask for defining semiconductor architectures, including contact trench openings to form trench silicide contacts.

16 Claims, 2 Drawing Sheets

EMBEDDED SILICON CARBIDE BLOCK PATTERNING

BACKGROUND

The present application relates generally to the manufacture of semiconductor devices, and more specifically to photolithography and masking architectures and their implementation in semiconductor device processing.

During the fabrication of semiconductor devices, features of a device on a semiconductor substrate are typically defined by a patterned mask. To provide increased feature density, the feature size is reduced, which may be achieved by reducing the critical dimension (CD) of the features. The foregoing requires improved patterning resolution, precision and accuracy.

The patterning and etching of features on the substrate typically involves forming multiple layers to affect the pattern transfer. Moreover, the various layers may be formed using distinct materials, processes, and tool sets. Simplification of the patterning architecture and associated processing without compromising pattern placement and CD control would be beneficial.

SUMMARY

Disclosed is a simplified lithography method and accompanying structure for decreasing the critical dimension (CD) and improving the CD uniformity within semiconductor devices during the manufacturing thereof. Exemplary methods and structures use a layer of silicon carbide as a blocking mask for defining semiconductor architectures, including trench openings to form trench silicide contacts. Compared to conventional methods, the use of silicon carbide, which can be etched selectively with respect to both oxide and nitride materials, can decrease the total number of patterning layers and etch steps used to form such structures.

According to various embodiments, a method of forming a semiconductor structure includes forming a first dielectric layer within trenches located between adjacent sidewall spacer layers and forming a silicon carbide layer over portions of the first dielectric layer, such that the silicon carbide layer overlies first trenches filled by the first dielectric layer. Portions of the first dielectric layer unmasked by the silicon carbide layer are then removed from within second trenches to open the second trenches.

In further embodiments, a method of forming a semiconductor structure includes forming a plurality of gate stacks over a semiconductor substrate, forming a spacer layer over sidewalls of the gate stacks, forming a first dielectric layer within trenches located between adjacent spacer layers, and forming a patterning structure over the gate stacks, the spacer layers and the first dielectric layer. The patterning structure may include, from bottom to top, an etch stop layer, an organic layer, an oxide layer, and a hard mask layer.

The patterning structure is etched to expose the first dielectric layer within first trenches and to expose the etch stop layer overlying the first dielectric layer with second trenches. A silicon carbide layer is then formed over exposed portions of the first dielectric layer. Using the silicon carbide layer as an etch mask, portions of the first dielectric layer unmasked by the silicon carbide layer are removed from within the second trenches to open the second trenches.

Portions of the silicon carbide layer may be retained in a final structure, such that a semiconductor structure includes a plurality of gate stacks disposed over a semiconductor substrate, a gate cap disposed over each gate stack, and a spacer layer disposed over sidewalls of the gate stacks and the gate caps. The structure also includes a first dielectric layer disposed within trenches located between adjacent spacer layers, and an embedded silicon carbide layer disposed over the first dielectric layer.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
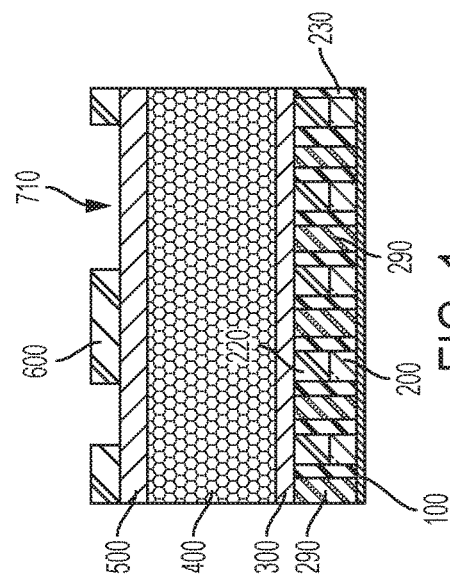
FIG. 1 is a schematic cross-sectional diagram of a lithography stack formed over the gate architecture of an example semiconductor device at an intermediate stage of fabrication.

Reference will now be made in greater detail to various embodiments of the subject matter of the present application, some embodiments of which are illustrated in the accompanying drawings. The same reference numerals will be used throughout the drawings to refer to the same or similar parts.

Illustrated in FIG. 1 is an exemplary patterning structure at an intermediate stage of fabrication. The patterning structure can be used to define features of a semiconductor device such as a FinFET device. In the illustrated embodiment, the patterning structure includes a stack comprising, from bottom to top, an etch stop layer 300, an organic layer 400, an oxide layer 500, and a previously-patterned hard mask layer 600. The patterning structure is formed over a semiconductor substrate 100, which may be a bulk substrate or a composite substrate such as a semiconductor-on-insulator (SOI) substrate.

A plurality of gate stacks 200 are arrayed over the substrate 100 beneath the patterning structure. The gate stacks 200 include a gate dielectric layer and a gate conductor layer (not separately shown). A gate cap 220 is disposed directly over each gate stack 200. Sidewall spacers 230 are formed over sidewalls of the gate stacks 200 and associated gate caps 220, and an interlayer dielectric (ILD) material layer 290 such as an ILD oxide is disposed between adjacent gate stacks, i.e., directly between adjacent sidewall spacers 230.

The gate dielectric layer may comprise a high-dielectric constant (high-k) material, and the gate conductor layer may comprise an electrically conductive material such as polysilicon or a metal such as tungsten. The gate cap 220 may comprise a layer of nitride material such as silicon nitride, which is aligned vertically with the gate stack 200. Sidewall spacers 230 may comprise a layer of a nitride material such as silicon nitride or silicon oxynitride, for example. The thickness of the sidewall spacers 230 may range from 4 to 20 nm, e.g., 4, 10, 15 or 20 nm, including ranges between any of the foregoing values. In various embodiments, the ILD layer 290 comprises a porous, low dielectric constant (low-k) oxide (e.g., porous $SiO_2$). The ILD layer 290 may be formed from a flowable oxide, for example. In the illustrated embodiment, respective top surfaces of the gate cap 220, sidewall spacers 230 and interlayer dielectric 290 are coplanar.

Although not shown, the semiconductor substrate 100 may include various device structures, such as the source, drain and channel regions of an exemplary transistor, and may further include isolation regions such as shallow trench isolation (STI) regions between adjacent devices, as is appreciated by one skilled in the art.

By way of example, after formation of the gate stacks 200, gate caps 220, and sidewall spacers 230, but prior to the formation of interlayer dielectric 290, source/drain junctions may be formed in or on a surface of the substrate 100 by selective epitaxy or by ion implantation at self-aligning locations with the sidewall spacers 230 between pairs of adjacent gate stacks 200.

Example epitaxial growth processes include low energy plasma deposition, liquid phase epitaxy, molecular beam epitaxy, and atmospheric pressure chemical vapor deposition. In certain embodiments, a dopant concentration within source/drain junctions may range from $1 \times 10^{19}$ atoms/cm$^3$ to $1 \times 10^{22}$ atoms/cm$^3$, e.g., $1 \times 10^{20}$ atoms/cm$^3$ to $1 \times 10^{21}$ atoms/cm$^3$.

Disposed over the semiconductor substrate 100 and over the gate stacks 200 is the patterning structure comprising plural layers, which may be formed one over the other in succession. According to various embodiments, the formation or deposition of a layer or structure may involve one or more techniques suitable for the material or layer being deposited or the structure being formed. Such techniques include, but are not limited to, chemical vapor deposition (CVD), low-pressure chemical vapor deposition (LPCVD), plasma enhanced chemical vapor deposition (PECVD), microwave plasma chemical vapor deposition (MPCVD), metal organic CVD (MOCVD), atomic layer deposition (ALD), molecular beam epitaxy (MBE), electroplating, electroless plating, ion beam deposition, spin-on coating, and physical vapor deposition (PVD) techniques such as sputtering or evaporation.

As will be appreciated, the patterning structure, in combination with one or more etching steps, may be used to create contact openings through the interlayer dielectric 290 to expose the source/drain junctions, for example, in order to create electrical contact thereto.

Referring still to FIG. 1, etch stop layer 300 may comprise an oxide layer such as a layer of silicon dioxide. Etch stop layer 300 may be plasma deposited or thermally deposited from a precursor suite comprising tetraethylorthosilicate (TEOS) and an oxygen source such as oxygen gas or ozone, or spun-on using TEOS as a precursor. The etch stop layer 300 may be formed directly over the planarized structure that includes gate stacks 200, sidewall spacers 230 and intervening interlayer dielectric layers 290. A thickness of the etch stop layer 300 may range from 10 to 30 nm, e.g., 10, 20 or 30 nm, including ranges between any of the foregoing values, although greater and lesser thicknesses are contemplated.

Organic layer 400 may comprise amorphous carbon (a-C) or a layer of a spin-on hard mask (SOH). By way of example, an amorphous carbon layer may be formed by a CVD process using a precursor gas mixture comprising a hydrocarbon source and a diluent gas at a deposition temperature of 200° C. to 700° C.

Exemplary hydrocarbon compounds that may be included in the hydrocarbon source used to form the amorphous carbon layer 400 may be described by the formula $C_xH_y$, where $1 \leq x \leq 10$ and $2 \leq y \leq 30$. Such hydrocarbon compounds may include, but are not limited to, alkanes such as methane, ethane, propane, butane and its isomer isobutane, pentane and its isomers isopentane and neopentane, hexane and its isomers 2-methylpentane, 3-methylpentane, 2,3-dimethylbutane, 2,2-dimethyl butane, and the like; alkenes such as ethylene, propylene, butylene and its isomers, pentene and its isomers, and the like; dienes such as butadiene, isoprene, pentadien, hexadiene and the like, and halogenated alkenes include monofluoroethylene, difluoroethylenes, trifluoroethylene, tetrafluoroethylene, monochloroethylene, dichloroethylenes, trichloroethylene, tetrachloroethylene, and the like; and alkynes such as acetylene, propyne, butyne, vinylacetylene and derivatives thereof. Further hydrocarbon compounds include aromatic molecules such as benzene, styrene, toluene, xylene, ethylbenzene, acetophenone, methyl benzoate, phenyl acetate, phenol, cresol, furan, and the like, as well as halogenated aromatic compounds including monofluorobenzene, difluorobenzenes, tetrafluorobenzenes, hexafluorobenzenes and the like.

Suitable diluent gases may include, but are not limited to, hydrogen ($H_2$), helium (He), argon (Ar), ammonia ($NH_3$), carbon monoxide (CO), carbon dioxide ($CO_2$), and mixtures thereof.

In further embodiments, organic layer 400 may comprise a spin-on hard mask, i.e., spin-on carbon. A spin-on hard mask can be used in lieu of an amorphous carbon layer, and may provide better layer-to-layer adhesion. Also, spin-on processes may provide higher throughput and present alternate material options compared to chemical vapor deposition. Typically, a spin-on hard mask layer such as a spin-on carbon (SOC) layer is formed from a high carbon-containing polymer solution, where the polymers are initially soluble in an organic solvent for coating and insoluble after curing.

An as-deposited organic layer 400 may be cured such as by exposure to UV radiation at a curing temperature greater than 200° C. The organic layer 400 may have a thickness of 50 to 200 nm, e.g., 50, 75, 100, 125, 150, 175 or 200 nm, including ranges between any of the foregoing values.

Formed over the organic layer 400 is an oxide layer 500. Oxide layer 500 may comprise a TEOS oxide, and may be formed using one or more of the processes described above in connection with etch stop layer 300. The oxide layer 500 may have a thickness of 20 to 50 nm, e.g., 20, 25, 30, 35, 40, 45 or 50 nm, including ranges between any of the foregoing values. In certain embodiments, oxide layer 500 may be omitted from the patterning structure.

A hard mask layer 600, such as a nitride hard mask layer, is formed over the oxide layer 500. An example hard mask layer 600 comprises silicon nitride, and may have a thickness of 20 to 50 nm, e.g., 20, 25, 30, 35, 40, 45 or 50 nm, including ranges between any of the foregoing values.

As will be appreciated, the compounds silicon nitride and silicon dioxide have compositions that are nominally represented as $Si_3N_4$ and $SiO_2$, respectively. As used herein, the terms "silicon nitride" and "silicon dioxide," refer to not only these stoichiometric compositions, but also to nitride and oxide compositions that deviate from the stoichiometric compositions.

As shown in FIG. 1, openings 710 in hard mask 600 may be formed using patterning and etching processes known to those skilled in the art. The patterning process may comprise photolithography, for example, which includes forming a layer of photoresist material (not shown) atop one or more layers to be patterned. The photoresist material may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed utilizing a conventional resist developer. The pattern provided by the patterned photoresist material is thereafter transferred into the hard mask layer 600 utilizing at least one pattern transfer etching process.

For example, a lithography etch, lithography etch (LELE) process using two or more lithography-etch cycles (e.g., a LELELE process) may be executed to transfer the pattern into the hard mask 600. Using plural lithography-etch (LE) cycles enable precise dimensional control of the remaining portions of the etched layers. According to various embodiments, the patterning structure can be used to define self-aligned source/drain contact trenches with line-space patterns having less than a 60 nm pitch (d) and less than a 30 nm critical dimension (CD).

As used herein, various pattern transfer etching processes may include an anisotropic etch. In embodiments, a dry etching process such as, for example, reactive ion etching (RIE) can be used. In other embodiments, a wet chemical etchant can be used. In still further embodiments, a combination of dry etching and wet etching can be used. The layer of photoresist may be removed during the pattern transfer etching processes or subsequently using, for example, a plasma ashing process.

In addition to the directional nature of an etch process, a factor associated with etching is etch selectivity. Etch selectivity refers to the ratio of etch rates of two different materials undergoing etching. In various scenarios, it is desired that a first material be etched faster than a second material.

A plasma reactor may be used to perform various etch processes on a semiconductor wafer. In such processes, a substrate is placed inside a vacuum chamber of the reactor and process gases, including etchant gases, are introduced into the chamber. The gases are energized to ignite and maintain a plasma. Depending upon the composition of the gases from which the plasma is formed, the plasma may be used to etch a particular material from the substrate. Selective etching processes have also been developed which depend more upon chemical effects. These processes are often described as reactive ion etching (RIE).

Plasma can be produced in various types of plasma reactors. Plasma reactors typically have energy sources which use RF energy, microwave energy, magnetic fields, etc. to produce a medium to high density plasma. During one or more of the disclosed etch processes, including etching of hard mask 600, oxide layer 500, organic layer 400, and/or etch stop layer 300, the plasma generated may comprise any plasma capable of being produced in a vacuum chamber, for example, by providing a grounded electrode and a second electrode connected to a source of RF power.

Figure 2:
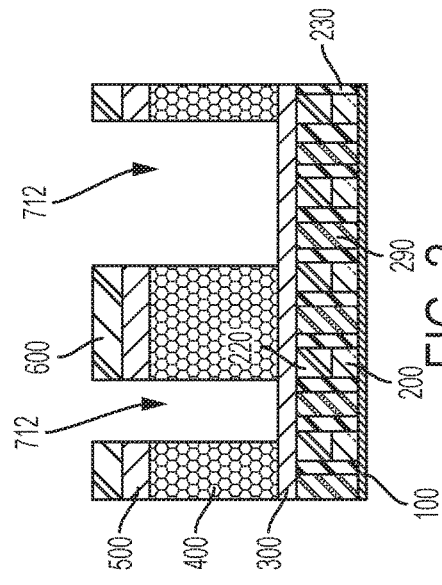
FIG. 2 shows etching through upper layers of the lithography stack to form openings that expose an etch stop layer over selected trench locations within the gate architecture.

Referring to FIG. 2, using the hard mask layer 600 as an etch mask, the pattern is extended through the oxide layer 500 and the organic layer 400 to form openings 712. Thus, openings 712 extend through hard mask layer 600, oxide layer 500 and organic layer 400, such that the openings 712 are defined directly over etch stop layer 300 and overlie areas of the underlying device architecture (e.g., ILD oxide layer 290) that are not to be completely removed during subsequent processing. That is, the remaining portions of the hard mask 600, oxide layer 500, and organic layer 400 overlie areas of the device architecture that will be etched and removed later in the process.

The hard mask layer 600 and the oxide layer 500, if used, can protect the fidelity of the pattern transfer into the organic layer 400 by minimizing gauging of the organic layer 400 during etching. Example reactive ion etching processes that may be used to transfer the pattern include an ion plasma comprising one or more of $CF_4$, $CHF_3$, $CH_3F$, $CH_2F_2$, $C_2F_6$, $C_4H_6$, $C_4H_8$, $C_4F_8$, $NF_3$, $N_2H_2$, $SF_6$, $Cl_2$, $HBr$, $H_2$, $He$, $CO$, $CO_2$, $N_2$, $O_2$, and $Ar$. The organic layer 400, for example, may be removed by etching with a plasma comprising oxygen. Etching breaks through the intermediate layers 500, 400 and exposes etch stop layer 300.

In certain embodiments, each opening 712 is a trench, which may have a width of 15 to 200 nm, for example, e.g., 15, 20, 30, 40, 50, 100, 150 or 200 nm, including ranges between any of the foregoing values.

Figure 3:
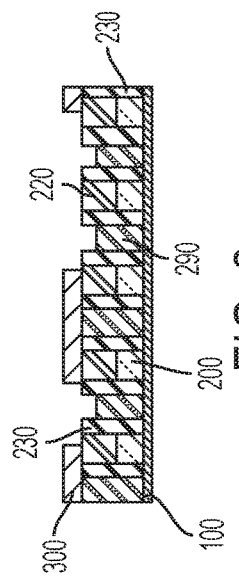
FIG. 3 shows a self-aligned contact etch through the etch stop layer and the attendant removal of the upper layers of the lithography stack.

Referring to FIG. 3, one or more etch steps are used to remove remaining portions of the hard mask 600, oxide layer 500, and organic layer 400, while simultaneously etching portions of the etch stop layer 300 unprotected by the overlying layers. The etching leaves etch stop layer 300 substantially intact over portions of ILD layer 290 that will be removed during subsequent processing, while the etching removes the etch stop layer 300 from over portions of ILD layer that will be retained. The one or more etch steps used to remove hard mask 600, oxide layer 500, organic layer 400 and portions of etch stop layer 300 may include a non-selective etch.

In various embodiments, hard mask 600 is removed prior to etching completely through the etch stop layer 300. Removal of the nitride hard mask 600 prior to etching through the etch stop layer 300 and exposing gate caps 220 and sidewall spacers 270 facilitates later removal of the amorphous carbon layer 400 without damaging the nitride layers 220, 270.

Figure 4:
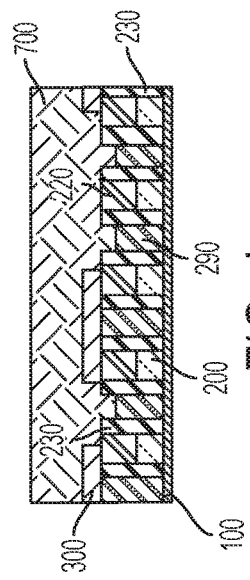
FIG. 4 depicts the blanket deposition of a silicon carbide blocking layer over the structure of FIG. 3.

Referring to FIG. 4, a silicon carbide (SiC) layer 700 is then deposited over etch stop layer 300 and ILD layer 290, i.e., directly over exposed portions of ILD layer 290. The silicon carbide layer covers the top and sidewall surfaces of etch stop layer 300, and completely covers the top surfaces of ILD layer 290. In embodiments where the ILD layer 290 is recessed, the silicon carbide layer may backfill the space created by removal of the ILD layer 290 such that a bottommost surface of the silicon carbide layer 700 is below a topmost surfaces of the gate cap 220 and the sidewall spacers 230. In such embodiments, the extent of the recess may be up to 50% of the height of the trench, e.g., 0, 5, 10, 20, 30, 40 or 50%, including ranges between any of the foregoing values. In alternative embodiments, a bottommost surface of the silicon carbide layer 700 may be co-planar with topmost surfaces of the gate cap 220 and the sidewall spacers 230.

The silicon carbide layer 700 may be deposited by chemical vapor deposition, for example. An example low pressure chemical vapor deposition process for depositing amorphous silicon carbide uses dicholorosilane ($SiH_2Cl_2$) as the precursor for silicon and a mixture of acetylene ($C_2H_2$) in hydrogen ($H_2$) as the precursor for carbon.

Figure 5:
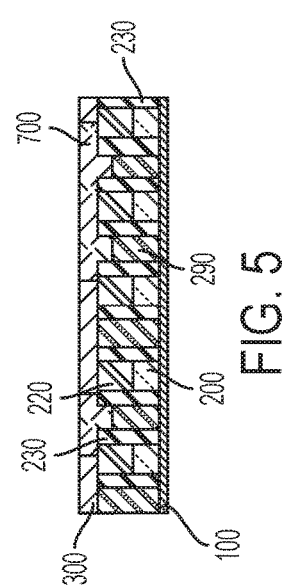
FIG. 5 shows polishing of the silicon carbide layer to form a planarized structure.

Referring to FIG. 5, the silicon carbide layer 700 is then polished to remove the overburden and planarize the structure. For instance, grinding or chemical mechanical polishing (CMP) may be used to planarize the structure. Chemical mechanical polishing (CMP) is a material removal process that uses both chemical reactions and mechanical forces to remove material and planarize a surface. In embodiments, a CMP process used to remove excess silicon carbide is highly selective to silicon dioxide. Thus, the etch stop layer 300 may function as a CMP etch stop, such that the top surface of the etch stop layer is substantially co-planar with a top surface of the silicon carbide layer 700, although some dishing of the silicon carbide layer may occur.

Example CMP processes for removing silicon carbide selective to oxide materials have a selectively of from 10:1 to 40:1, e.g., 10:1, 20:1, 25:1, 30:1, 35:1 or 40:1, including ranges between any of the foregoing ratios. Such CMP processes may also remove silicon carbide selective to nitride materials with comparable selectivity. The structure shown in FIG. 5 includes an embedded silicon carbide block mask 700.

According to various embodiments, the embedded silicon carbide block mask 700 may have a bottommost surface, i.e., corresponding to an inlaid portion thereof, that extends below a topmost surface of the gate cap 220 and the sidewall spacers 230, and have a topmost surface that is above topmost surfaces of the gate cap 220 and the sidewall spacers 230. In further embodiments, the embedded silicon carbide block mask 700 may have a bottommost surface that extends below a bottommost surface of etch stop layer 300.

Figure 6:
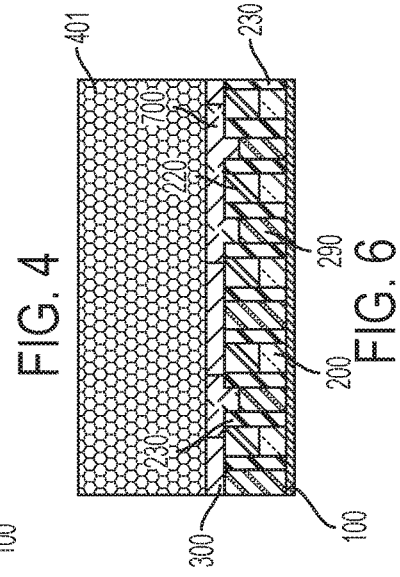
FIG. 6 shows the deposition of an optional sacrificial hard mask over the planarized structure of FIG. 5.

Referring to FIG. 6 an optional sacrificial organic layer 401 is deposited over the planarized structure of FIG. 5. The materials and processes described above in connection with organic layer 400 may be used to form organic layer 401. In particular embodiments, organic layer 401 comprises amorphous carbon (a-C).

Figure 7:
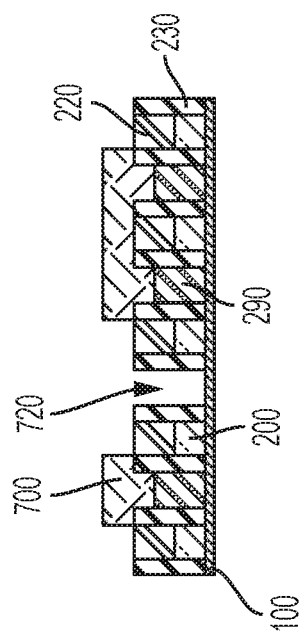
FIG. 7 is a device structure showing the opening of selected trenches using the silicon carbide layer as an etch mask.

Referring to FIG. 7, using the embedded silicon carbide layer as a blocking mask, exposed portions of the etch stop layer 300 and the ILD oxide 290 are etched selectively with respect to the gate cap 220 and the sidewall spacers 270 to form self-aligned source/drain contact trenches 720. During the etching process that removed oxide layers 290, 300, the organic layer 401 is also removed. In various embodiments, the trenches 720 expose source/drain junctions between adjacent gate stacks 200. Trenches 720 may have a height and a width that independently vary from 5 to 100 nm, and a corresponding aspect ratio of 2:1 or greater, e.g., 2:1, 5:1, 10:1, 15:1 or 20:1, including ranges between any of the foregoing values.

A reactive ion etch such as a plasma etch can be used to remove the etch stop layer 300 and the ILD oxide 290. Perfluorocarbon (PFC) and hydrofluorocarbon (HFC) compounds such as $CF_4$, $CHF_3$, $C_2F_6$, $C_3F_8$, $C_4F_6$ and $C_4F_8$ may be used as etching agents together with a source of oxygen, such as oxygen gas or ozone, and a carrier gas such as Ar, He, $N_2$, etc., in order to selectively etch silicon dioxide relative to silicon, polysilicon and/or silicon nitride.

According to various embodiments, sacrificial organic layer 401 may contribute to the etch selectivity of the ILD oxide 290 and etch stop layer 300 with respect to the nitride gate cap 220 and nitride sidewall spacers 270. Such selectivity facilitates complete removal of the ILD oxide 290 from within trenches between adjacent sidewall spacers. Without wishing to be bound by theory, when a fluorine-containing hydrocarbon such as $C_4F_6$ is used as an etchant, fluorocarbon radicals are created in the plasma and form a passivating layer of a carbon and fluorine-containing polymer that deposits on the material layers being etched, e.g., exposed oxide and nitride surfaces. However, the polymer is dissociated by oxygen-containing species that are formed during etching of the exposed ILD oxide layers 290, 300. Thus, the polymer is deposited preferentially over the nitride layers 220, 270 and decreases the nitride etch rate.

By incorporating a carbon source (i.e., organic layer 401) in the patterning structure proximate to the oxide and nitride layers, the ILD oxide 290 will be etched from within trenches 720 while the nitride layers will etch at a substantially slower rate due to the formation thereon of a passivating polymer coating. For instance, the etch selectivity may range from 2:1 to 20:1, e.g., 2:1, 4:1, 10:1, 15:1 or 20:1, including ranges between any of the foregoing values.

Further to its function as a source of gas phase carbon, any residual organic layer 401 can be removed, such as by plasma ashing. For instance, residual organic layer 401 may be removed with a plasma comprising ozone, oxygen, ammonia, hydrogen, or combinations thereof.

In various embodiments, the plasma process used to etch the ILD oxide layer 290 and form contact trenches 720 uses a high density plasma. As used herein, "high density" plasma is plasma generated by an electromagnetically coupled plasma generator. The term "electromagnetically coupled plasma generator" refers to any type of plasma generator that uses an electromagnetic field, rather than a capacitively-coupled generator to produce the plasma. Such electromagnetically-coupled plasma generators can create plasma having an ion density of greater than $10^{10}$ ions/cm$^3$, which is a characteristic of "high density" plasma. Example electromagnetically-coupled plasma generators include an electron cyclotron resonance (ECR) type plasma generator, and an inductively-coupled helical or cylindrical resonator.

In certain embodiments, the source power of such high density plasma may range from 500 Watts to 5 kiloWatts (kW), depending upon the particular type of plasma generator, chamber size, desired etch rate, etc. RF bias power, for example, is typically applied to the electrode on which the substrate resides, while the chamber wall or another electrode is used as ground.

Figure 8:
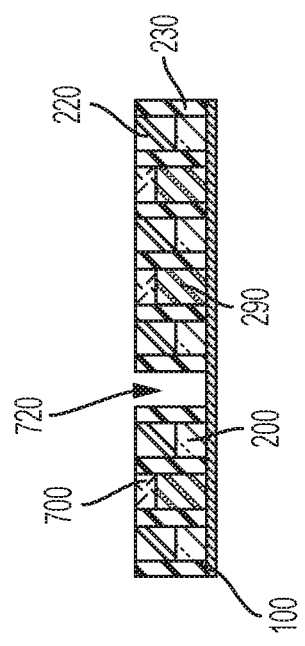
FIG. 8 shows polishing of the silicon carbide layer to form a planarized structure according to certain embodiments.

Referring to FIG. 8, in embodiments where the silicon carbide layer 700 extends into unopened trenches, a further polishing step may be used to planarize the inlaid silicon carbide layer 700 with respect to the gate cap 220 and the sidewall spacers 230.

The disclosed self-aligned contact method uses an embedded silicon carbide block mask in conjunction with a direct patterning platform to define trenches, e.g., source/drain contact trenches, with a high degree of accuracy and precision. However, while described in the context of self-aligned source/drain contacts, the foregoing method may be integrated with any appropriate trench process scheme to form conductive contacts or interconnects.

The present method introduces a silicon carbide layer as a trench etch block cap, which can simplify optical patterning solutions compared to conventional patterning methods. In various embodiments, the instant approach decreases the number of layers used in the lithography stack, as well as the number of processing steps used to achieve a desired pattern transfer.

For instance, relative to a comparative patterning process, which utilizes seven layer-forming deposition steps, a wet strip, a CMP step, and two separate RIE systems to perform six total RIE steps, the present method eliminates the need for the wet strip, and uses six deposition steps, a CMP step, and only two RIE steps to achieve an analogous structure.

As used herein, the singular forms "a," "an" and "the" include plural referents unless the context clearly dictates otherwise. Thus, for example, reference to a "contact trench" includes examples having two or more such "contact trenches" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to an etch block cap that comprises silicon carbide include embodiments where an etch block cap consists essentially of silicon carbide and embodiments where an etch block cap consists of silicon carbide.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a semiconductor structure, comprising:
    forming a first dielectric layer within trenches located between adjacent sidewall spacer layers;
    forming a silicon carbide layer over portions of the first dielectric layer, wherein the silicon carbide layer overlies first trenches filled by the first dielectric layer; and
    removing portions of the first dielectric layer unmasked by the silicon carbide layer from within second trenches to open the second trenches.

2. The method of claim 1, further comprising:
    forming a patterning structure over the first dielectric layer, the patterning structure comprising, from bottom to top, an etch stop layer, an organic layer, an oxide layer, and a hard mask layer; and
    etching the patterning structure to expose the first dielectric layer within the first trenches and to expose the etch stop layer overlying the first dielectric layer within the second trenches.

3. The method of claim 2, wherein the organic layer comprises a spin-on hard mask.

4. The method of claim 1, further comprising forming an etch stop layer over the first dielectric layer disposed within the second trenches.

5. The method of claim 4, further comprising forming the etch stop layer prior to forming the silicon carbide layer.

6. The method of claim 4, further comprising polishing the silicon carbide layer to form an inlaid silicon carbide layer having a top surface substantially co-planar with a top surface of the etch stop layer.

7. The method of claim 6, wherein a bottom surface of the inlaid silicon carbide layer extends below a bottom surface of the etch stop layer.

8. A method of forming a semiconductor structure, comprising:
    forming a plurality of gate stacks over a semiconductor substrate;
    forming a spacer layer over sidewalls of the gate stacks;
    forming a first dielectric layer within first and second trenches located between adjacent spacer layers;
    forming a patterning structure over the gate stacks, the spacer layers and the first dielectric layer, the patterning structure comprising, from bottom to top, an etch stop layer, an organic layer, an oxide layer, and a hard mask layer;
    etching the patterning structure to expose the first dielectric layer within the first trenches and to expose the etch stop layer overlying the first dielectric layer with the second trenches;
    forming a silicon carbide layer over the exposed portions of the first dielectric layer; and
    removing portions of the first dielectric layer unmasked by the silicon carbide layer from within the second trenches to open the second trenches.

9. The method of claim 8, wherein opening the second trenches exposes an epitaxial source/drain junction.

10. The method of claim 8, wherein the organic layer comprises a spin-on hard mask.

11. The method of claim 8, further comprising polishing the silicon carbide layer to form an inlaid silicon carbide layer having a top surface substantially co-planar with a top surface of the etch stop layer.

12. The method of claim 11, wherein a bottom surface of the inlaid silicon carbide layer extends below a bottom surface of the etch stop layer.

13. The method of claim 8, wherein the etch stop layer comprises silicon dioxide.

14. A semiconductor structure, comprising:
    a plurality of gate stacks disposed over a semiconductor substrate;
    a gate cap disposed over each gate stack;
    a spacer layer disposed over sidewalls of the gate stacks and the gate caps;
    a first dielectric layer disposed within trenches located between adjacent spacer layers; and
    a silicon carbide layer disposed over the first dielectric layer, wherein a top surface of the silicon carbide layer is substantially co-planar with top surfaces of the gate caps and the spacer layers.

15. The semiconductor structure of claim 14, wherein the silicon carbide layer is disposed directly over the first dielectric layer.

16. The semiconductor structure of claim 14, wherein the silicon carbide layer is amorphous.

* * * * *